(12) United States Patent
Ankoudinov et al.

(10) Patent No.: US 8,633,521 B2
(45) Date of Patent: Jan. 21, 2014

(54) SELF-BOOTSTRAPPING FIELD EFFECT DIODE STRUCTURES AND METHODS

(75) Inventors: Alexei Ankoudinov, Redmond, WA (US); Vladimir Rodov, Seattle, WA (US)

(73) Assignee: STMicroelectronics N.V., Geneva (CH)

( * ) Notice: Subject to any disclaimer, the term of this patent is extended or adjusted under 35 U.S.C. 154(b) by 252 days.

(21) Appl. No.: 12/683,425

(22) Filed: Jan. 6, 2010

(65) Prior Publication Data

US 2010/0271851 A1 Oct. 28, 2010

Related U.S. Application Data

(63) Continuation of application No. 12/238,308, filed on Sep. 25, 2008, now Pat. No. 8,148,748, which is a continuation of application No. 12/359,094, filed on Jan. 23, 2009, now Pat. No. 8,421,118.

(60) Provisional application No. 61/142,647, filed on Jan. 6, 2009, provisional application No. 60/975,467, filed on Sep. 26, 2007, provisional application No. 61/022,968, filed on Jan. 23, 2008.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .... 257/288; 257/142; 257/148; 257/E21.051; 257/E21.053; 257/E21.352; 257/E21.366; 257/E21.435

(58) Field of Classification Search
USPC .......... 257/401, 512, E27.028, E27.009, 257/E27.029, E27.325, 288, 142, 143, 144, 257/124, 127, 294, E21.051, E21.053, 257/E21.352, E21.366, E21.435; 361/58, 361/111; 438/213, 279
See application file for complete search history.

(56) References Cited

U.S. PATENT DOCUMENTS

| 3,602,777 | A |   | 8/1971 | Berman |
| 3,603,811 | A |   | 9/1971 | Day et al. |
| 4,281,448 | A |   | 8/1981 | Barry et al. |
| 4,373,252 | A |   | 2/1983 | Caldwell |
| 4,533,970 | A | * | 8/1985 | Brown ............................ 361/58 |
| 4,599,576 | A |   | 7/1986 | Yoshida et al. |

(Continued)

FOREIGN PATENT DOCUMENTS

| EP | 0322400 A2 | 6/1989 |
| EP | 0 807 979 A2 | 11/1997 |

(Continued)

OTHER PUBLICATIONS

Office Action dated Sep. 16, 2009 from U.S. Appl. No. 12/238,308.

(Continued)

*Primary Examiner* — David Nhu
(74) *Attorney, Agent, or Firm* — Wolf, Greenfield & Sacks, P.C.

(57) ABSTRACT

A two terminal device which can be used for the rectification of the current. Internally it has a regenerative coupling between MOS gates of opposite type and probe regions. This regenerative coupling allows to achieve performance better than that of ideal diode.

11 Claims, 12 Drawing Sheets

UMOS implementation #1

UMOS implementation #2

(56) References Cited

U.S. PATENT DOCUMENTS

| | | |
|---|---|---|
| 4,610,730 A | 9/1986 | Harrington et al. |
| 4,630,084 A | 12/1986 | Tihanyi |
| 4,722,856 A | 2/1988 | Albrecht et al. |
| 4,783,348 A | 11/1988 | Albrecht et al. |
| 4,843,441 A * | 6/1989 | Willard ............ 257/270 |
| 4,903,189 A | 2/1990 | Ngo et al. |
| 4,955,069 A | 9/1990 | Ionescu |
| 4,962,411 A | 10/1990 | Tokura et al. |
| 4,967,243 A | 10/1990 | Baliga et al. |
| 4,969,028 A | 11/1990 | Baliga |
| 4,980,741 A | 12/1990 | Temple |
| 4,982,260 A | 1/1991 | Chang et al. |
| 4,996,581 A | 2/1991 | Hamasaki |
| 5,019,530 A | 5/1991 | Kleinsasser et al. |
| 5,021,861 A | 6/1991 | Baliga |
| 5,070,377 A | 12/1991 | Harada |
| 5,111,253 A | 5/1992 | Korman et al. |
| 5,304,831 A | 4/1994 | Yilmaz et al. |
| 5,381,025 A | 1/1995 | Zommer |
| 5,387,805 A | 2/1995 | Metzler et al. |
| 5,396,085 A | 3/1995 | Baliga |
| 5,410,171 A | 4/1995 | Tsuzuki et al. |
| 5,416,354 A | 5/1995 | Blackstone |
| 5,430,315 A | 7/1995 | Rumennik |
| 5,446,295 A | 8/1995 | Whitney |
| 5,532,502 A | 7/1996 | Seki |
| 5,545,573 A | 8/1996 | Narazaki et al. |
| 5,554,880 A | 9/1996 | Metzler et al. |
| 5,559,355 A | 9/1996 | Yamazaki et al. |
| 5,621,234 A | 4/1997 | Kato |
| 5,629,536 A | 5/1997 | Heminger et al. |
| 5,643,809 A | 7/1997 | Lien |
| 5,719,411 A | 2/1998 | Ajit |
| 5,742,463 A * | 4/1998 | Harris ............ 361/88 |
| 5,744,994 A | 4/1998 | Williams |
| 5,747,841 A | 5/1998 | Ludikhuize |
| 5,751,025 A | 5/1998 | Heminger et al. |
| 5,818,084 A | 10/1998 | Williams et al. |
| 5,825,079 A | 10/1998 | Metzler et al. |
| 5,869,380 A | 2/1999 | Chang |
| 5,877,515 A | 3/1999 | Ajit |
| 5,886,383 A | 3/1999 | Kinzer |
| 5,898,982 A | 5/1999 | Metzler et al. |
| 5,929,690 A | 7/1999 | Williams |
| 5,932,922 A | 8/1999 | Metzler et al. |
| 5,956,582 A | 9/1999 | Ayela et al. |
| 6,034,385 A | 3/2000 | Stephani et al. |
| 6,048,788 A * | 4/2000 | Huang et al. ............ 438/629 |
| 6,051,850 A | 4/2000 | Park |
| 6,078,074 A * | 6/2000 | Takebuchi et al. ............ 257/316 |
| 6,097,046 A | 8/2000 | Plumton |
| 6,100,145 A | 8/2000 | Kepler et al. |
| 6,169,300 B1 | 1/2001 | Fragapane |
| 6,172,398 B1 | 1/2001 | Hshieh |
| 6,186,408 B1 | 2/2001 | Rodov et al. |
| 6,225,280 B1 | 5/2001 | Dokter et al. |
| 6,235,601 B1 | 5/2001 | Kim |
| 6,242,324 B1 * | 6/2001 | Kub et al. ............ 438/455 |
| 6,258,634 B1 | 7/2001 | Wang et al. |
| 6,268,758 B1 | 7/2001 | Limmer et al. |
| 6,281,547 B1 | 8/2001 | So et al. |
| 6,313,001 B1 | 11/2001 | Johansson et al. |
| 6,323,091 B1 | 11/2001 | Lee et al. |
| 6,331,455 B1 | 12/2001 | Rodov et al. |
| 6,362,036 B1 | 3/2002 | Chiozzi et al. |
| 6,373,097 B1 | 4/2002 | Werner |
| 6,384,456 B1 | 5/2002 | Tihanyi |
| 6,399,996 B1 | 6/2002 | Chang et al. |
| 6,404,033 B1 | 6/2002 | Chang et al. |
| 6,420,225 B1 | 7/2002 | Chang et al. |
| 6,426,541 B2 | 7/2002 | Chang et al. |
| 6,448,160 B1 | 9/2002 | Chang et al. |
| 6,459,108 B1 | 10/2002 | Bartsch et al. |
| 6,476,442 B1 | 11/2002 | Williams et al. |
| 6,498,367 B1 | 12/2002 | Chang et al. |
| 6,515,330 B1 | 2/2003 | Hurtz et al. |
| 6,537,860 B2 | 3/2003 | Akiyama et al. |
| 6,624,030 B2 | 9/2003 | Chang et al. |
| 6,630,698 B1 | 10/2003 | Deboy et al. |
| 6,653,740 B2 * | 11/2003 | Kinzer et al. ............ 257/778 |
| 6,724,039 B1 | 4/2004 | Blanchard |
| 6,743,703 B2 | 6/2004 | Rodov et al. |
| 6,765,264 B1 | 7/2004 | Chang et al. |
| 6,784,489 B1 | 8/2004 | Menegoli |
| 6,828,605 B2 | 12/2004 | Eisele et al. |
| 6,853,036 B1 | 2/2005 | Rodov et al. |
| 6,897,682 B2 | 5/2005 | Nadd |
| 6,956,266 B1 | 10/2005 | Voldman et al. |
| 6,967,374 B1 | 11/2005 | Saito et al. |
| 6,979,861 B2 | 12/2005 | Rodov et al. |
| 6,992,353 B1 | 1/2006 | Wu |
| 7,009,253 B2 | 3/2006 | Rodov et al. |
| 7,087,981 B2 | 8/2006 | Kapels et al. |
| 7,095,113 B2 | 8/2006 | Xiaochun et al. |
| 7,220,319 B2 | 5/2007 | Sago et al. |
| 7,250,668 B2 | 7/2007 | Chang et al. |
| 7,264,999 B2 | 9/2007 | Xiaochun et al. |
| 7,342,389 B1 | 3/2008 | Wu et al. |
| RE40,222 E | 4/2008 | Fragapane |
| 7,781,826 B2 | 8/2010 | Mallikararjunaswamy et al. |
| 7,893,489 B2 * | 2/2011 | Kobayashi ............ 257/331 |
| 8,148,748 B2 | 4/2012 | Ankoudinov et al. |
| 8,445,947 B2 * | 5/2013 | Battista et al. ............ 257/288 |
| 2001/0045635 A1 * | 11/2001 | Kinzer et al. ............ 257/685 |
| 2002/0019115 A1 | 2/2002 | Rodov et al. |
| 2002/0024375 A1 | 2/2002 | Asano et al. |
| 2002/0177324 A1 | 11/2002 | Metzler |
| 2003/0025152 A1 | 2/2003 | Werner et al. |
| 2003/0146474 A1 * | 8/2003 | Ker et al. ............ 257/347 |
| 2003/0207538 A1 | 11/2003 | Hshieh et al. |
| 2003/0222290 A1 | 12/2003 | Rodov et al. |
| 2004/0041619 A1 | 3/2004 | Nadd |
| 2005/0029585 A1 | 2/2005 | He et al. |
| 2005/0116313 A1 | 6/2005 | Lee et al. |
| 2005/0152080 A1 | 7/2005 | Harris et al. |
| 2005/0189626 A1 | 9/2005 | Xiaochun et al. |
| 2005/0189658 A1 | 9/2005 | Xiaochun et al. |
| 2005/0200384 A1 | 9/2005 | Nadd |
| 2005/0200394 A1 | 9/2005 | Underwood et al. |
| 2005/0231355 A1 | 10/2005 | Hair, III et al. |
| 2005/0243496 A1 * | 11/2005 | Harris ............ 361/118 |
| 2006/0097323 A1 | 5/2006 | Rodov et al. |
| 2006/0098363 A1 * | 5/2006 | Hebert et al. ............ 361/56 |
| 2006/0098364 A1 | 5/2006 | Harris et al. |
| 2006/0098373 A1 | 5/2006 | Hebert et al. |
| 2006/0145260 A1 * | 7/2006 | Kim ............ 257/355 |
| 2006/0158812 A1 | 7/2006 | Harris |
| 2006/0158816 A1 * | 7/2006 | Harris ............ 361/118 |
| 2006/0176638 A1 | 8/2006 | Coates |
| 2006/0244060 A1 | 11/2006 | Kapels et al. |
| 2006/0250736 A1 * | 11/2006 | Harris ............ 361/56 |
| 2006/0285264 A1 | 12/2006 | Harris |
| 2007/0235752 A1 | 10/2007 | Rodov et al. |
| 2007/0246794 A1 | 10/2007 | Chang et al. |
| 2008/0017930 A1 * | 1/2008 | Kim et al. ............ 257/369 |
| 2008/0079035 A1 | 4/2008 | Bobde |
| 2008/0137249 A1 * | 6/2008 | Harris ............ 361/88 |
| 2008/0192394 A1 | 8/2008 | Harris |
| 2008/0265975 A1 | 10/2008 | Takasu et al. |
| 2008/0284383 A1 | 11/2008 | Aas et al. |
| 2009/0026492 A1 | 1/2009 | Chatty et al. |

FOREIGN PATENT DOCUMENTS

| | | |
|---|---|---|
| JP | 04-343260 A | 11/1992 |
| JP | 05082534 A | 4/1993 |
| JP | 05175206 A | 7/1993 |
| JP | 06061250 A | 3/1994 |

(56) References Cited

FOREIGN PATENT DOCUMENTS

| JP | 06112149 A | 4/1994 |
|---|---|---|
| JP | 08-017933 A | 1/1996 |

OTHER PUBLICATIONS

Office Action dated Aug. 9, 2010 from U.S. Appl. No. 12/359,094.
Office Action/Restriction Requirement dated Sep. 16, 2009 from U.S. Appl. No. 12/359,094.
Office Action dated Sep. 21, 2009 from U.S. Appl. No. 12/431,580.
Final Office Action dated Dec. 8, 2010 from U.S. Appl. No. 12/431,580.
Extended European Search Report dated Jan. 5, 2011 from European Application No. 09813383.8.
International Search Report dated Mar. 10, 2009 from International Application No. PCT/US2009/031885.
Written Opinion of the International Searching Authority dated Mar. 10, 2009 from International Application No. PCT/US2009/031885.
International Search Report dated Dec. 4, 2008 from International Application No. PCT/US2008/077747.
International Search Report dated Aug. 16, 2010 from International Application PCT/US2010/020284.
International Search Report dated Dec. 20, 2010 from International Application PCT/US2010/033451.
International Search Report dated Jun. 19, 2009 from International Application PCT/US2009/041996.
Written Opinion of the International Searching Authority dated Jun. 19, 2009 from International Application PCT/US2009/041996.
Ankudinov, A. et al, "High injection regime of the super barrier(TM) rectifier," Solid-State Electronics, vol. 51, No. 5, pp. 714-718.
Ankudinov, A. et al. "Electrostatic force microscopy study of the electric field distribution in semiconductor laser diodes under applied biases," 9th Int. Symp. "Nanostructures: Physics and Technology," St. Petersburg, Russia, Jun. 18-22, 2001, pp. 198-201.
Ankudinov, A. et al., "Fine Structure of the Inner Electric Field in Semiconductor Laser Diodes Studied by EFM," Phys. Low-Dim. Struct., 3/4, 2001, pp. 9-16.
Ankudinov, A. et al., "Study of high power GaAs-based laser diodes operation and failure by cross-sectional electrostatic force microscopy," 10th Int. Symp. Nanostructures: Physics and Technology, Jun. 17-21, 2002, St. Petersburg, Russia, pp. 143-145.
Bashirov, A.M. et al., "Switching of thyristors using the dU/dt effect," Radiotekhnika i Elektronika, vol. 14, No. 2, USSR, Feb. 1969, pp. 374-375.
Bixby, B. et al., "Application Considerations for Very High Speed Fast Recovery Power Diodes," IEEE, IAS 1977 Annual, pp. 1023-1027.
Chelnokov, E. et al, "Effect of moving charge carriers in a collector junction of p-n-p-n structure on the switching on process," Radiotekhnika I Elektronika, v 16, USSR, 1971, pp. 1039-1046.
Christiansen, B. "Synchronous Rectification," PCIM, Aug. 1998, pp. 14-21.
Hikin, B. et al., "Reverse Recovery Process with Non-Uniform Lifetime Distribution in the Base of a Diode," IEEE, IAS 1977 Annual, pp. 644-647.
Huth, G., "Study of the Spatial Characteristics of the Breakdown Process in Silicon PN-Junctions," Proc. of the 2nd Int. Conf. on Transmutation Doping in Semiconductors, University of Missouri, Columbia, MO, Apr. 23-26, 1978, pp. 91-108.
Kuz'Min, V.A. et al., "P-N-P-N-Structures Turning on At High-Voltage and High-Current Density, " Radiotekhnika I Elektronika, vol. 20, No. 7, USSR, 1975, pp. 1457-1465.
Kuz'Min, V.A. et al., "The turn-on process of p-n-p-n structures at high voltages and a high current density," Radiotekhnika i Elektronika, vol. 20, No. 8, USSR, Aug. 1975, pp. 1710-1714.
Kuz'Min, V.A. et al., "Turn-on of a p-n-p-n structure at a high current density," Radiotekhnika i Elektronika, vol. 18, No. 1, USSR, Jan. 1973, pp. 158-166.
Lorenz, L. et al., "Improved MOSFET, An Important Milestone Toward a New Power MOSFET Generation," PCIM, Sep. 1993, pp. 14-21.
Melnik, Y. et al., "HVPE GaN and AlGaN "Substrates" for Homoepitaxy," Materials Science Forum vols. 164-268, 1998, pp. 1121-1124.
Molibog, N.P. et al., "The effect of mobile charge carriers in the collector junction of a p-n-p-n structure on the turn-on process," Radiotekhnika i Elektronika, vol. 16, No. 6, USSR, Jun. 1971, pp. 1039-1046.
Pavlik, V.Y. et al., "The I-V characteristic of a p-n-p-n structure in the 'on' state for high residual voltages," Radiotekhnika i Elektronika, vol. 18, No. 7, USSR, Jul. 1974, pp. 1468-1475.
Rodov, V. et al, "Super barrier rectifier—a new generation of power diode," IEEE Transactions on Industry Applications, vol. 44, No. 1, pp. 234-237.
Rodov, V.I. et al., "Calculation of the Current-Voltage characteristic of an unsaturated p-n-p-n structure," Radiotekhnika i Elektronika, vol. 19, No. 6, USSR, Jun. 1974, pp. 1325-1326.
Rodov, V.I., "Non-one-dimensional processes in p-n-p-n structures," Poluprovodnikovye Pribory i ikh Primenenie, No. 28, USSR, 1974, pp. 3-22.
Vemulapati, U. et al., "The Concept of a Regenerative Diode", IEEE, 2007, pp. 193-196.
Office Action dated Mar. 3, 2011 from U.S. Appl. No. 12/359,094.
Office Action dated Mar. 3, 2011 from U.S. Appl. No. 12/238,308.
Office Action from U.S. Appl. No. 12/431,580, dated May 9, 2012.
Office Action from U.S. Appl. No. 13/398,591 dated Jul. 26, 2012.
Office Action from U.S. Appl. No. 12/359,094 dated Aug. 15, 2012.
Extended European Search Report from related European Patent Application No. 09739614.7, dated Nov. 12, 2012.
Office Action from U.S. Appl. No. 12/431,580 dated Dec. 21, 2012.
Office Action from U.S. Appl. No. 12/773,003 dated Dec. 6, 2012.

* cited by examiner

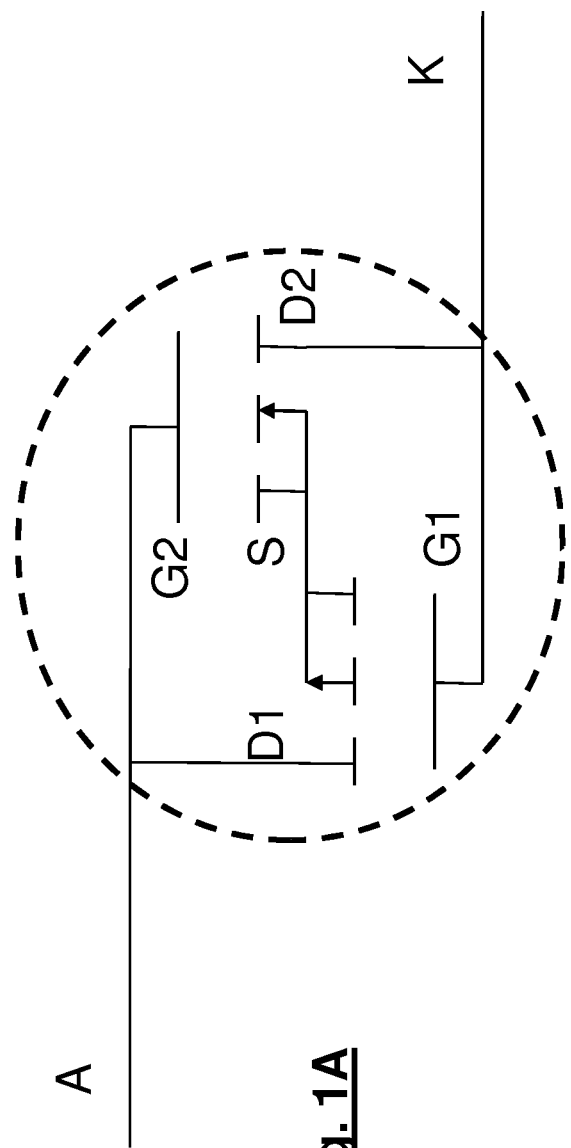
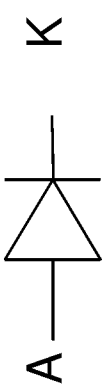
Fig. 1A
Fig. 1B

US 8,633,521 B2

SELF-BOOTSTRAPPING FIELD EFFECT DIODE STRUCTURES AND METHODS

CROSS-REFERENCE

Priority is claimed from U.S. provisional application 61/142,647 filed 6 Jan. 2009, which is hereby incorporated by reference. Priority is also claimed from U.S. patent application Ser. No. 12/238,308 filed 25 Sep. 2008, and therethrough from U.S. Provisional Application 60/975,467 filed 26 Sep. 2007, both of which are hereby incorporated by reference. Priority is also claimed from U.S. application Ser. No. 12/359,094 filed Jan. 23, 2009, and therethrough from U.S. Provisional Application 61/022,968 filed Jan. 23, 2008; these applications too are hereby incorporated by reference.

BACKGROUND

The present application relates to diode and rectifier structures and methods, and more particularly to structures and methods which include positive feedback in the device-level operation.

Note that the points discussed below may reflect the hindsight gained from the disclosed inventions, and are not necessarily admitted to be prior art.

Diodes are very common circuit elements used to perform rectification of an oscillating input signal. A typical rectifying diode has two external electrodes, and conducts current readily in a forward direction (ON state), and permits only small or no current flows in the reverse direction (OFF state). Schottky barrier diodes and synchronous rectifiers are typically used to perform this function for signals with amplitudes of less than 10V.

Schottky barrier diodes are simple to use but not very efficient. Typically they have a forward voltage drop above 0.35V at room temperature. If the output signal is 3.3V, then approximately 10% of the power will be wasted for rectification. This large energy loss for rectification is unacceptable for modern power supplies.

The ideal diode equation limits the forward voltage drop $V_F$ for a given rectification ratio to $$V_F > \frac{kT}{q}\ln(1 + I_F/I_R)$$

where $I_F$ is a forward current, $V_F$ is the forward bias voltage, $I_R$ is the leakage current, k is Boltzmann's constant, and $kT/q=0.0259V$ at room temperature T.

For example, for a Schottky diode conducting a current of 2 A, with 20 µA leakage current, the forward voltage drop is larger than 0.3V. There is very small room for improvement of Schottky diodes since they cannot be better than ideal.

To overcome the high losses on rectifiers for low voltage applications, synchronous rectification is often used. (See e.g. Cryssis G., "High Frequency Switching Power Supplies: Theory and Design", McGraw-Hill, Inc., 2 edition 1989, p. 144. This entire book is hereby incorporated by reference.) Use of a MOSFET to perform the rectification function of the diode allows voltage drop on a rectifier be reduced to about 0.1V, leading to increased efficiency. However, the circuit implementation of synchronous rectification becomes more complicated. A controller is needed to provide the gate voltage and to change the MOSFET from the ON to the OFF state. Sensors are needed to tell the controller that the sign of the applied voltage has changed. This additional signal processing reduces both the speed of operation and reliability, and also substantially increases the cost of synchronous rectifiers because instead of a simple diode, one needs a much more complicated and expensive circuit.

Prior applications of the present inventors have described a "Regenerative Building Block" device, or "RBB." This is a four-terminal device, which not only includes source/gate/drift/drain operating conventionally, but also a probe node which is connected to the drift region separately from the drain. As shown in Published US application US2009/0185404, the probe node can for example be positioned as if it were a lateral DMOS drain, while the main current flow goes vertically downward to a backside drain contact. Two such RBBs can be connected to provide a half-bridge, and two such half-bridges of opposite polarity can be connected together to provide a full-wave rectifier. The RBB itself is a useful building block, which is also used in some embodiments of the present application.

SUMMARY

The present application discloses new approaches to rectification, and new device structures used for these approaches. In some embodiments two field-effect devices of opposite polarities (opposite conductivity types) are connected back-to-back in a common-source configuration with gate connections which provide positive feedback, so that their drain terminals can serve as anode and cathode of (for example) a two-terminal rectifying diode.

The disclosed innovations, in various embodiments, provide one or more of at least the following advantages. However, not all of these advantages result from every one of the innovations disclosed, and this list of advantages does not limit the various claimed inventions.

Reduced forward voltage drop;
Improved efficiency;
Reduced leakage current;
Improved reverse recovery;
Simpler fabrication than a Schottky diode;
Less overhead circuitry than a synchronous rectifier; and
Ease of integration.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 1A/1B show a regenerative diode made of P-channel and N-channel MOSFETs. FIG. 1A shows the internal arrangement of an embodiment, while FIG. 1B shows how the device can be represented in conventional nomenclature.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application provides several new classes of device, a self-bootstrapping rectifying diode, which can be viewed as a regenerative combination of MOSFETs and/or RBBs. In an embodiment, the device is particularly suited to fabrication of devices such as general-purpose rectifiers. Although those skilled in the art will quickly recognize that the present invention can be used to create a variety of semiconductor devices, for purposes of clarity the present invention will be described in the context of a rectifier.

Internally, it is built as a regenerative combination of MOSFETs and/or regenerative building blocks of the type described in Provisional U.S. Patent Application 61/022,968, Appendix B hereto: one of a P-type and the other of the N-type. The regenerative wiring produces the effect that two MOSFETs (RBBs) help each other to stay ON and also to stay OFF, depending on the direction of current flow. An embodiment of a regenerative diode made from two RBB's exhibits better than ideal diode performance similar to synchronous rectifiers. Since the regenerative diode has only two contacts, the control signal complexity of conventional synchronous rectifiers is avoided.

To achieve significant performance gains, the threshold voltage of each device is well controlled by carefully managing gate oxide thickness and dopant concentration under the gate. In an embodiment, good control over the dopant concentration is achieved using channel boron (arsenic) implantation step.

A generalized schematic representation of the internal configuration of one embodiment of a regenerative diode, comprising a combination of a specially-constructed N-type MOSFET G2 and a specially-constructed P-type MOSFET G1, is shown in FIG. 1A. The source electrodes S of the two MOSFET's are shorted. The drain electrode D2 of the N-type MOSFET G2 serves as a cathode K for the regenerative diode, and the drain electrode of the P-type MOSFET G1 as an anode A. When both MOSFETs are ON (forward bias), the gates have additional voltage that tend to open the channel for both MOSFETs. When both MOSFETs are OFF (reverse bias) the gate signals have opposite polarity and tend to close the channels. Thus the regenerative connection helps both MOSFETs to stay ON and to stay OFF. Thus, in terms of black box operation, the device operates as a diode, and can be represented by the conventional diode symbol shown in FIG. 1B.

Figure 2:
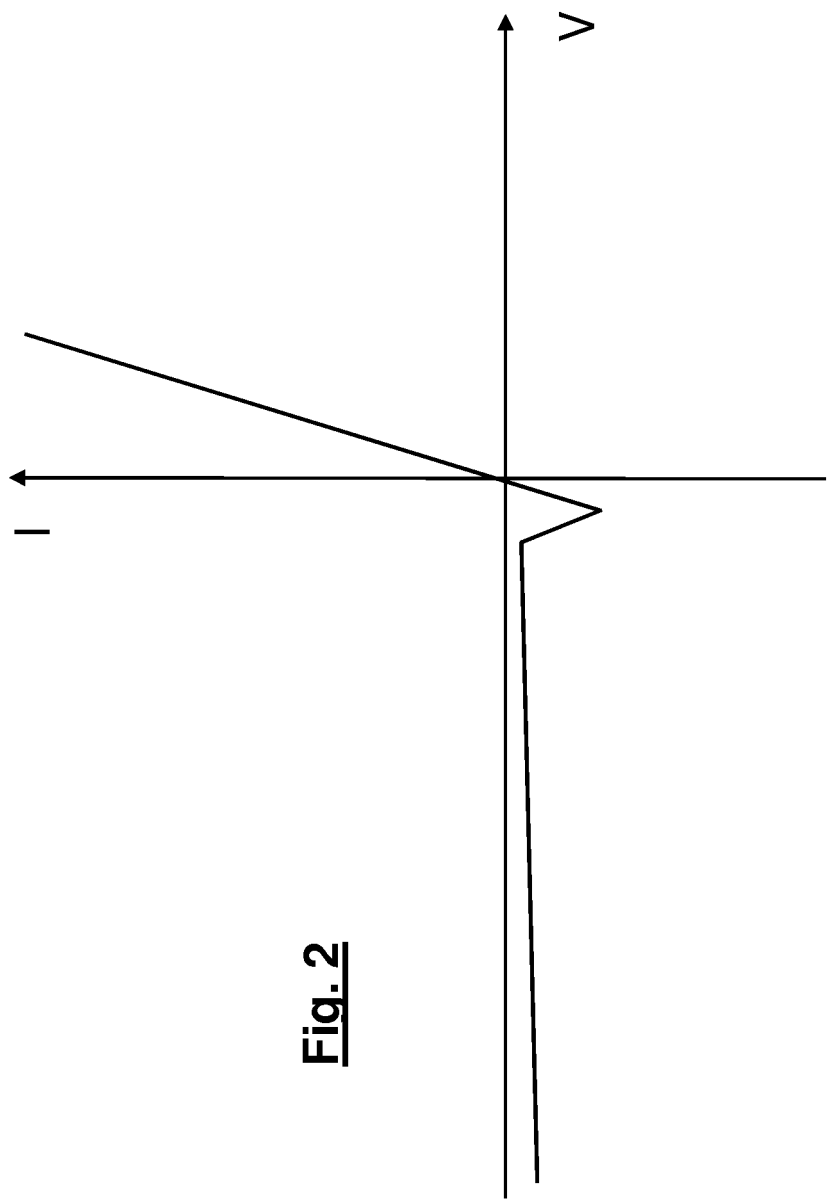
FIG. 2 shows the expected IV curve for a regenerative diode.

FIG. 2 shows the schematic I-V curve, including all quadrants, for the regenerative diode operation of an embodiment of a device in accordance with the invention. It looks like a regular diode I-V curve, except for the negative resistance region, which is a result of device physics. The shape of the curve as a whole, including the negative resistance region, depends on geometry and the doping concentrations of the constituent MOSFETs and therefore is adjustable. Notice that, to operate at small voltages, each MOSFET should have a small threshold voltage and therefore a small gate oxide thickness. For lower power devices, such as those incorporated into integrated circuits, which typically have all three terminals on the top surface, full drain voltage still can be applied to the gate in many embodiments. However, for embodiments designed for handling significant power, practically one cannot apply full drain voltage to the low threshold gate, since the thin gate oxide may be damaged and the device may be destroyed.

In those cases where applying the full drain to source voltage can be dangerous for the gate, a regenerative building block (RBB) can replace one or both MOSFETs. The RBB has an additional probe electrode. The probe electrode of the RBB provides a low voltage and well-defined regenerative signal, which is well-suited for the gate electrode of the adjacent device.

Figure 3:
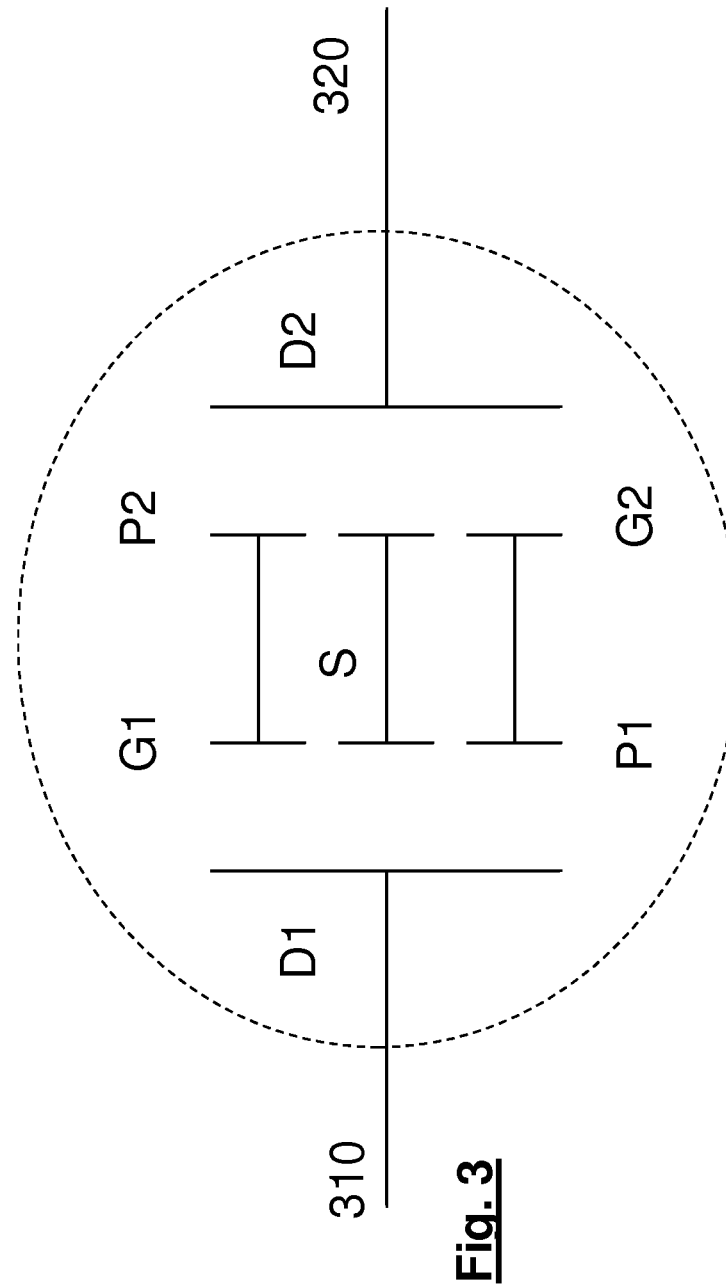
FIG. 3 shows a regenerative diode made from P-channel and N-channel RBBs (Regenerative building block elements).

FIG. 3 shows a regenerative diode made from P-channel and N-channel RBBs (Regenerative building block elements). The Probe electrode of each RBB is connected to the Gate electrode of the other RBB for automatic switching between ON and OFF states. In the illustrated embodiment, RBB1 is p-type and RBB2 is n-type. The gate electrode of each RBB, indicated as G1 and G2, is controlled by a regenerative signal from the probe contact P2 (and P2') of the other RBB. The source electrodes S are shorted. The resulting regenerative diode has only two external contacts at each drain, with drain 310, connected to D1 serving as the anode, and drain 320, connected to D2, serving as the cathode. The device can thus be represented as a regular diode, as shown.

Figure 4:
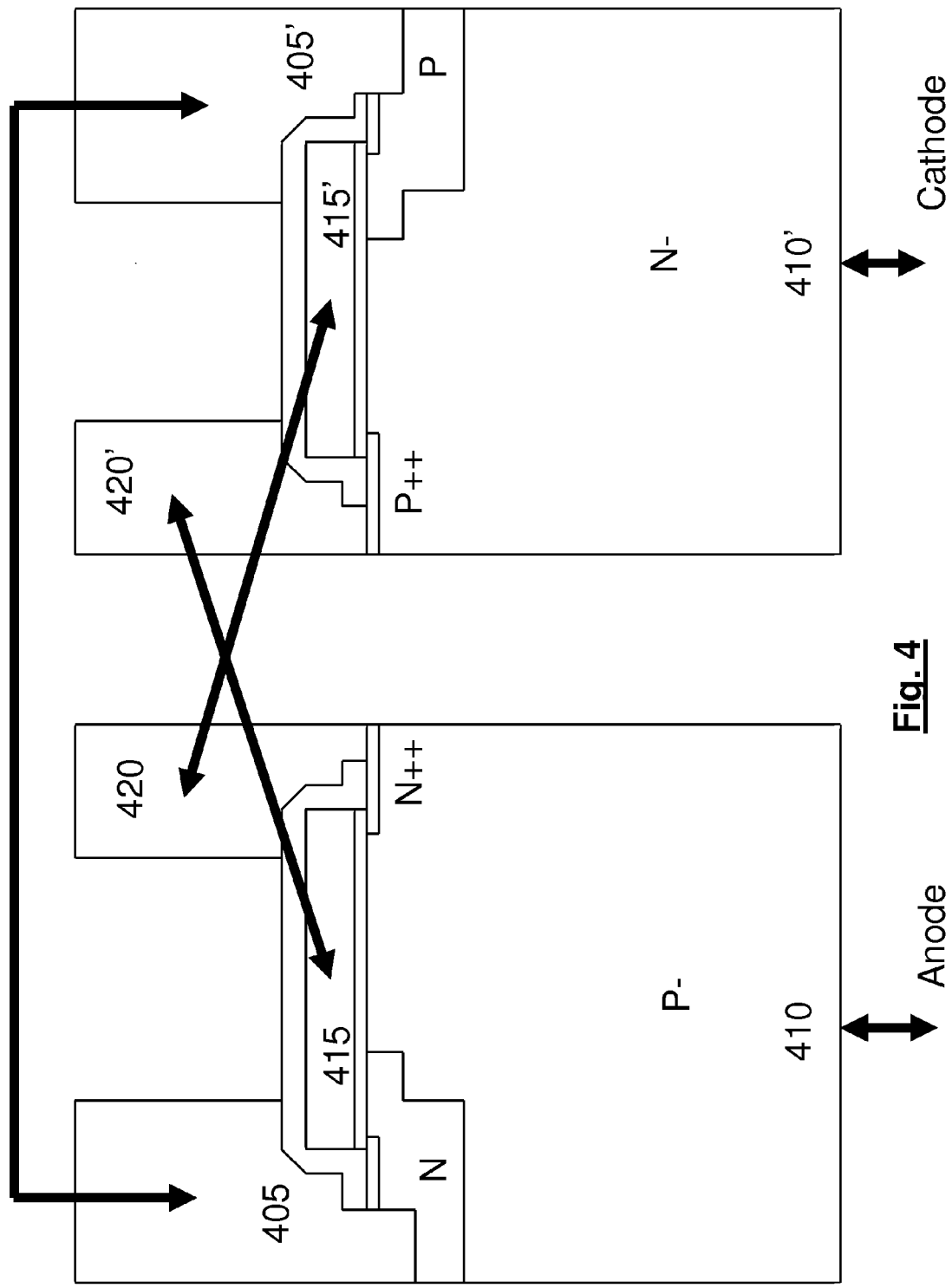
FIG. 4 shows an example of a discrete structure in which two RBBs are cross-coupled to provide a rectifying diode.

FIG. 4 shows an example of a discrete structure in which two RBBs are cross-coupled to provide a rectifying diode. The source contacts 405 and 405' of two RBB's are shorted together. The gate electrodes 415 and 415' of each RBB are controlled by a regenerative signal from the probe contact 420 or 420' of the other RBB. The only two external contacts are the drains 410 and 410'. The drain contact 410' of N-type RBB serves as cathode and the drain contact 410 of the P-type RBB serves as the anode. For the forward bias, when positive voltage is applied to the anode, the current flows up from drain 410 to Probe region contact node (the n++connected to contact 420) and then horizontally from this Probe region through the channel under the gate 415 to the P-type source and its contact 405. Then current flows from source contact 405' and the n-type source to Probe region 420' horizontally, and then vertically from Probe region to the cathode (or drain 410'). For the reverse bias the current flows in the opposite direction. The big regions where the current flows vertically allow one to make devices with higher rated voltage, compared to those of FIG. 1 (or FIG. 9).

Figure 5:
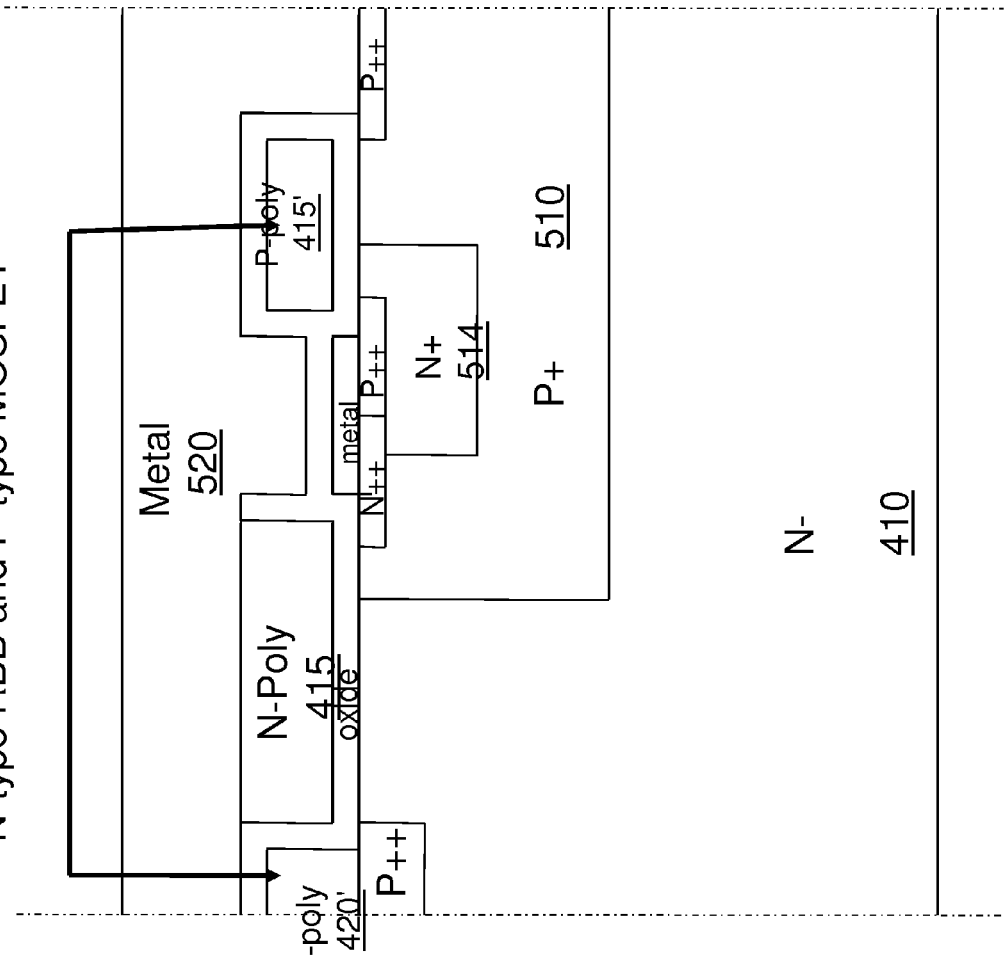
FIG. 5 shows an example of a regenerative diode made using n-type RBB and p-type MOSFET.

Rectifying diodes, in accordance with another family of embodiments, can be also made from a combination of an RBB and a MOSFET. FIG. 5 demonstrates one example of such a regenerative diode, which in this example is made using n-type RBB and p-type MOSFET. The RBB and MOSFET are integrated into one device. In an embodiment, the thickness of the gate oxide and the doping in the channel region are carefully managed to optimize device performance. In addition, N++doping in the probe opening is preferred over P++ doping in at least some embodiments. A metal contact to the probe region might be preferred over the P-poly contact 420' in some embodiments.

Figure 6:
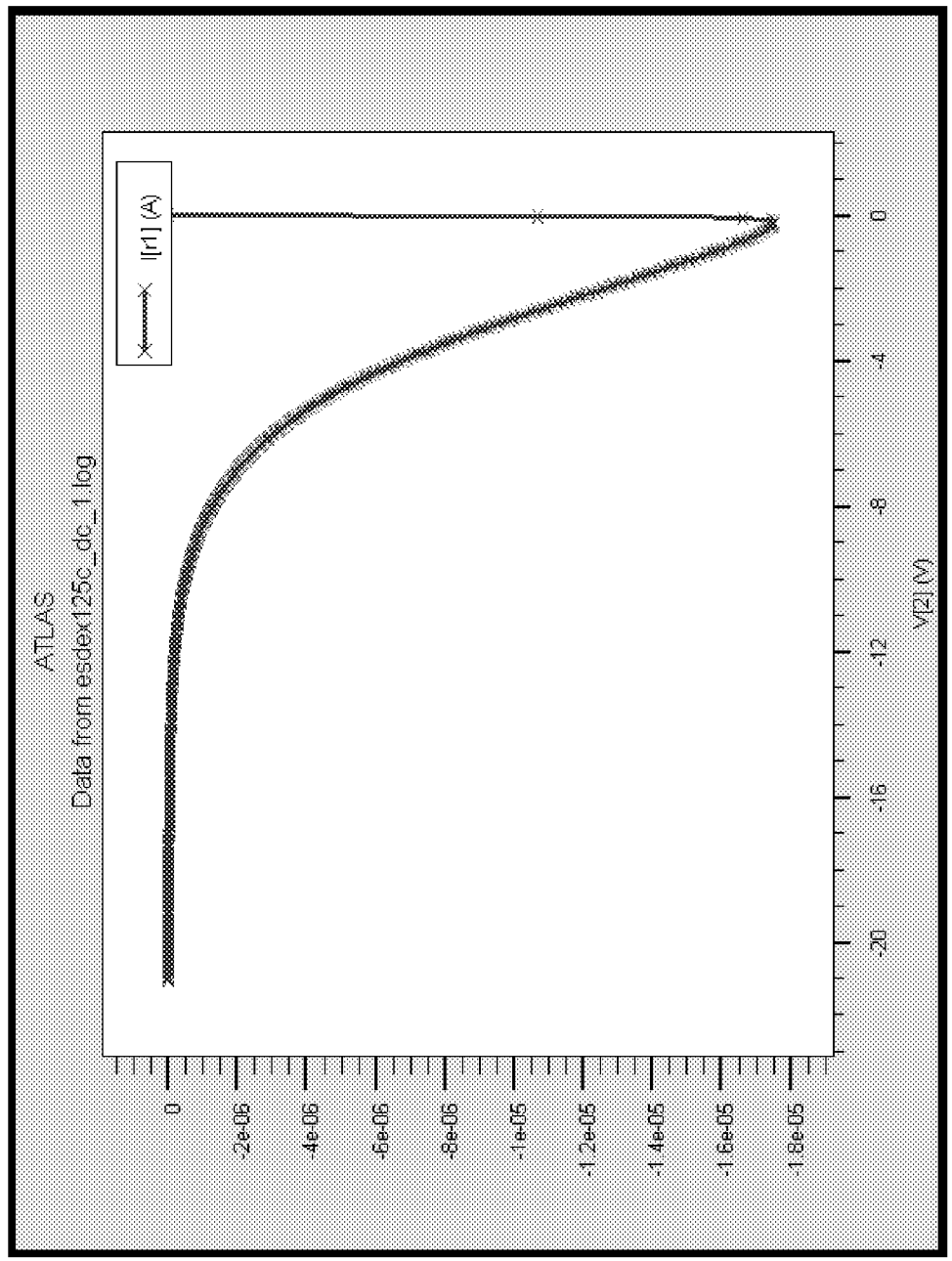
FIG. 6 shows a simulation of leakage current vs. reverse bias for a regenerative diode made from two normally ON RBBs.

Computer simulations with TCAD software were performed for the design shown in FIG. 5. The result for the reverse bias is shown on FIG. 6. The expected negative resistance region is observed for reverse bias above 0.2V (IR=18 µA). The leakage current is less than 20 µA for any reverse bias below 20V. This figure shows a simulation of leakage current vs. reverse bias for a regenerative diode made from two normally ON RBBs. Leakage current is less than 20 µA for any reverse bias.

Figure 7:
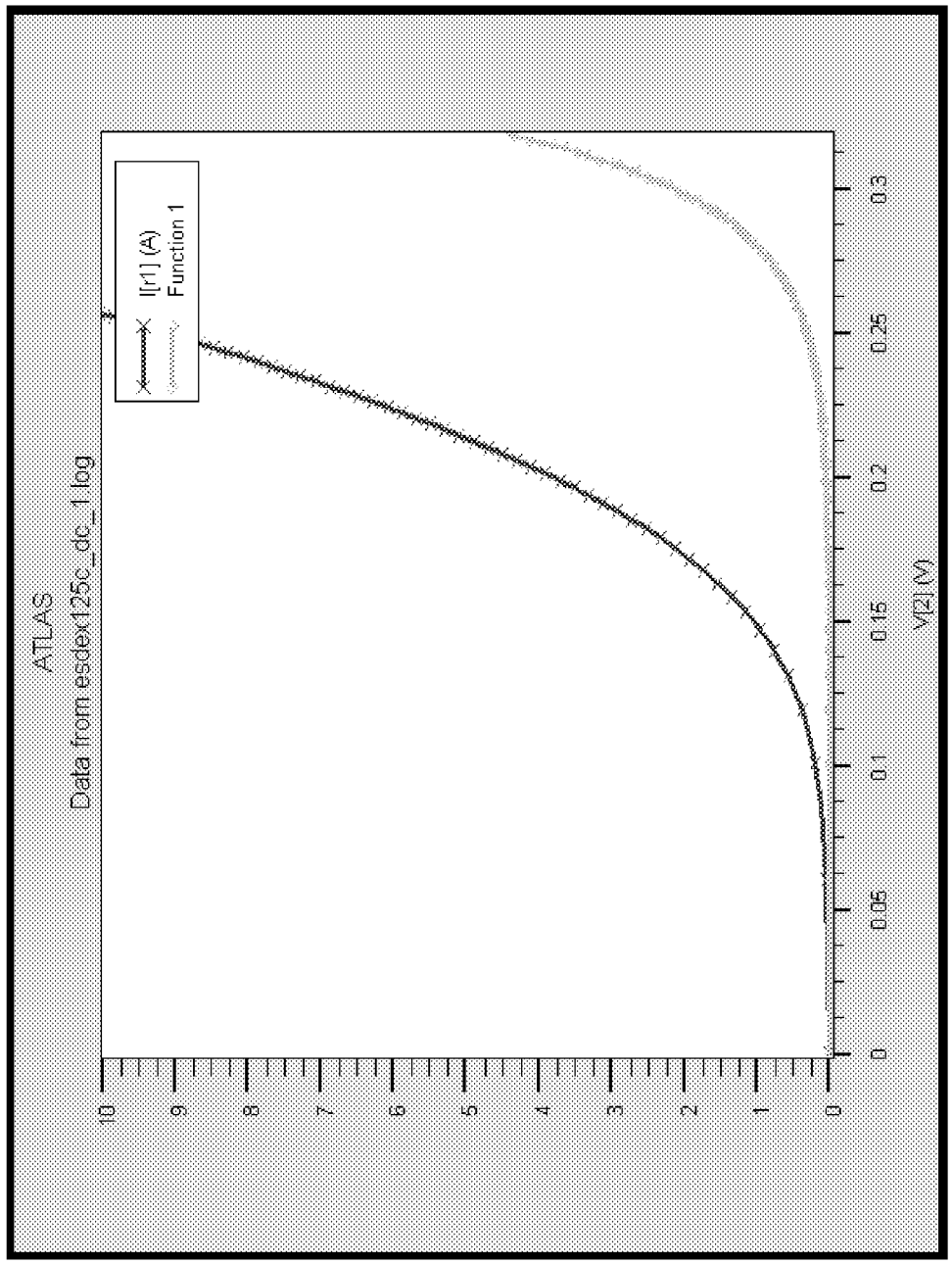
FIG. 7 shows a simulation of forward voltage drop vs. applied current for a regenerative diode and for an ideal diode with 20 µA leakage current.

FIG. 7 shows a simulation of forward voltage drop vs. applied current for a regenerative diode (black line). The gray curve is the IV curve for an ideal diode with 20 µA leakage current. The forward voltage on a diode at 1 A current is about 0.15V, while the 'ideal' diode has VF=0.28V. Thus the performance of a regenerative diode in accordance with the invention is better than that of an ideal diode! To obtain the same VF the ideal diode should have area about 100 times bigger than a regenerative diode as disclosed herein.

It can therefore be appreciated that the performance characteristics of regenerative diode in accordance with the invention are approaching those of synchronous rectifiers, while the device of the present invention does not need either a controller or the circuit associated with the controller implementation typically required of synchronous rectifiers.

Figure 8:
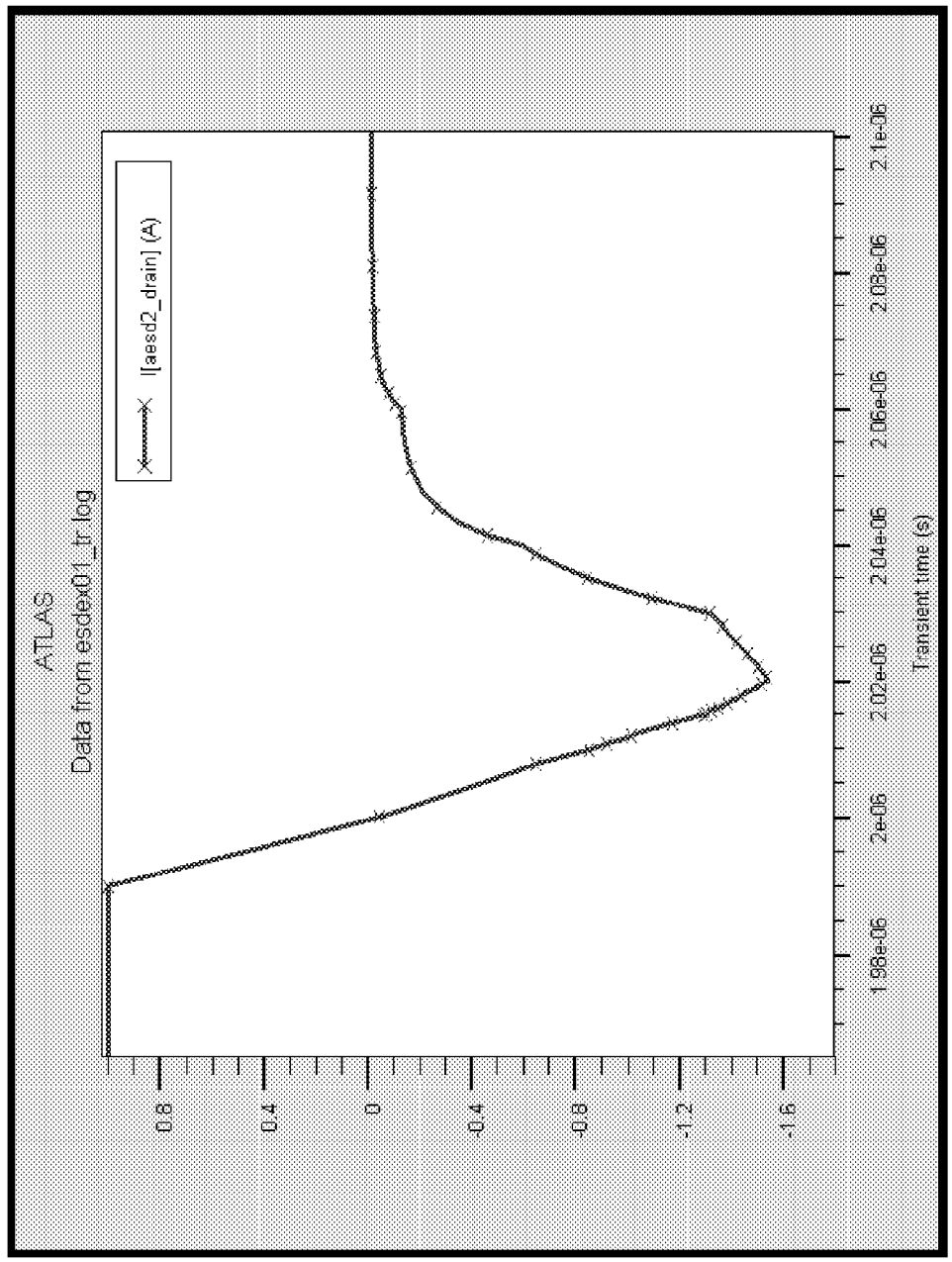
FIG. 8 shows a simulation of reverse recovery characteristics of a sample regenerative diode.

The reverse recovery transient behavior of the regenerative diode is shown in FIG. 8. It demonstrates that transient time is about 50 ns, which is typical reverse recovery time of the synchronous rectifier's body diode. The transient behavior of the RBB's can be optimized to provide maximum frequency operation with minimum EMI by changing doping profiles and devices geometries, including particularly channel boron dosage, gate oxide thickness, and the width of the probe opening. The transient behavior typically is impacted by the gate capacitance, since carriers are accumulated under the gate during forward bias. The gate oxide on the RBB can be thinned, or, as discussed hereinafter, removal of part of the gate during processing assists in compensating for any capacitance increase. From the foregoing, it can be appreciated that the regenerative diodes of the present invention do not need additional circuit elements and, due to their improved performance relative to the art, also permit increased frequency of operation.

Figure 9:
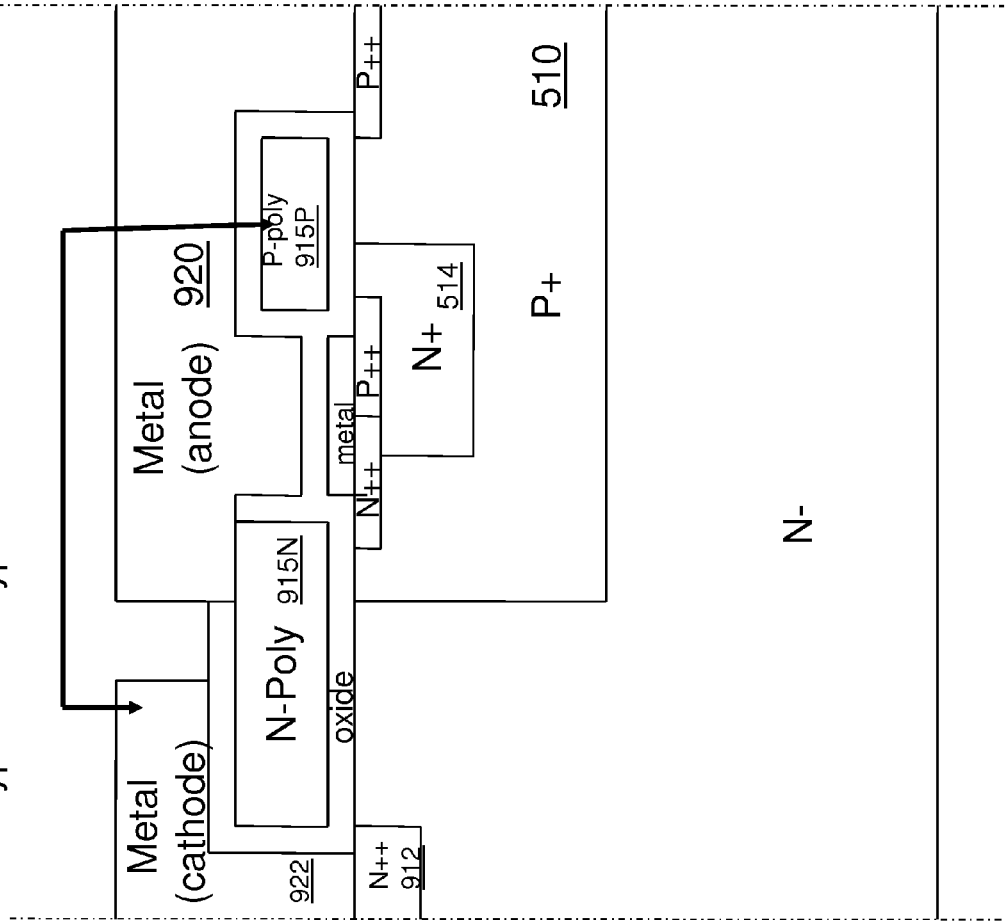
FIG. 9 shows an example of a regenerative diode made using n-type and p-type MOSFETs.

FIG. 9 shows an example of a regenerative diode made using n-type and p-type MOSFETs. Both anode and cathode contacts are on the surface of silicon. This sample embodiment is made from n-type and p-type MOSFETs, according to the schematics shown on FIG. 1. This implementation is particularly suitable for implementation in the integrated circuits, since both contacts (anode and cathode) lie on the top of the structure.

It will be appreciated from the foregoing that careful control of threshold voltage of each device can result in materially improved performance. This can be achieved by carefully managing gate oxide thickness and dopant concentration under the gate. In an embodiment, good control over the dopant concentration is achieved using a channel boron (arsenic) implantation step.

In at least some embodiments a gate oxide thickness in the range of 50-100 Å has proven effective for at least some embodiments. For polysilicon gates on N and P type material, the dopant concentration in the channel region is generally in the range 3E16-6E17 cm$^{-3}$ for a regenerative diode, and more frequently in the range 2-4E17, and in the range of 8E17-2E18 for half-bridge embodiments. For metal gates, where the work function differs from polysilicon, the range of dopant concentration can change for some embodiments, and can be approximately 5E16-5E18.

For reverse voltages above 5V, embodiments like that of FIG. 5 are generally preferable to those like FIG. 9. The structure on FIG. 9 has the problem, since typical gate oxide thickness is about 50 Å, which can withstand only 5V. (higher voltage will damage the gate).

On FIG. 5 there is a small current through P++(or N++) Probe zone to charge the gate of MOSFET. In static situation this current is zero (otherwise the charge on the gate will be increasing).

Configuration of the RBB with an N− drift region is preferred over P− drift region. It will lead to smaller forward voltage VF, since electron mobility is about 3 times higher than hole mobility.

Typically there is practically no current through the P-well in FIGS. 5 and 9. Current goes horizontally from anode to cathode in FIG. 5, and both P and N drift regions do not carry current.

In FIG. 5, optionally one can design big P and small N regions. In FIG. 9 Current goes horizontally from anode to the Probe region and then vertically from Probe region to cathode.

In FIG. 9 the voltage on the probe node will be roughly in between the two drain voltages. However, in FIG. 5 the V_DS on RBB will be higher than V_DS on MOSFET during reverse bias. RBB has N− drift region that allows it to develop a wide depletion region, and thus withstand high voltage.

Figure 10:
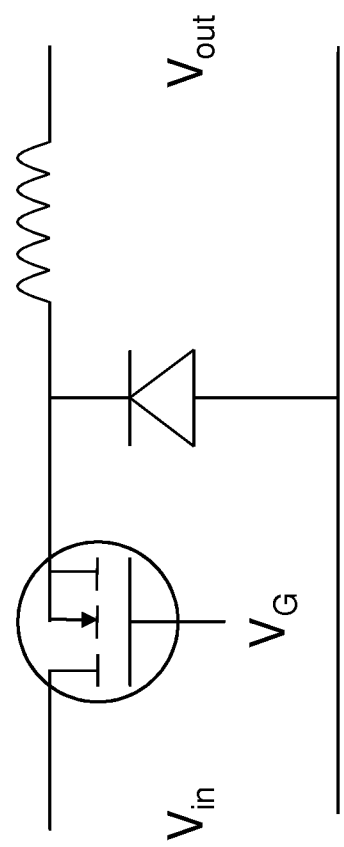
FIG. 10 shows a sample circuit implementation, in which a rectifying diode like that of FIG. 4, 5, 8, 11, or 12 is used in the Buck converter.

One of the typical application for the regenerative field effect diode is shown in FIG. 10. It can be used instead as a diode in the Buck converter. For the diode with rated voltage of 20V, the voltage drop on Schottky diode is about 0.35V, which can significantly contribute to the losses for the output voltage Vout<10V. Thus often the synchronous rectifier is used in the Buck circuit for the low voltage applications. It can provide very low forward losses, since forward voltage drop is typically around 0.1V. However, the use of synchronous rectifiers may slow down the operation frequency of the Buck converter. One should avoid the situation when both MOSFET and diode of the Buck converter are in the ON state, because it will short the input. Therefore during switching there is some time when both MOSFET and diode are in OFF state, which requires reducing the frequency. In addition, since the current through inductor cannot be stopped, a freewheeling diode should be placed in parallel with synchronous rectifier, leading to the cost increase. The regenerative diode will have the forward voltage drop about 0.2V and will automatically switch from ON to OFF state. Thus it will provide a better efficiency than Schottky diode with similar switching speed. The regenerative diode will have smaller efficiency than synchronous rectifier, but it will have simpler circuit implementation, cost less and can be operated at higher frequency.

In this circuit the control voltage VG is provided by PWM chip, which turns ON and OFF the discrete MOSFET. For the low voltage application, the diode should be replaced by synchronous rectifier. There is some dead time when both MOSFET and synch. rectifier both in OFF state, and therefore one needs freewheeling diode in parallel with synch. rectifier. The regenerative rectifying diode will automatically switch between ON and OFF and will be faster than synch. rectifier. The VF of regenerative diode is about 0.2V, that of the synch. rectifier -about 0.1V, and Schottky diode about 0.35V.

Figure 11:
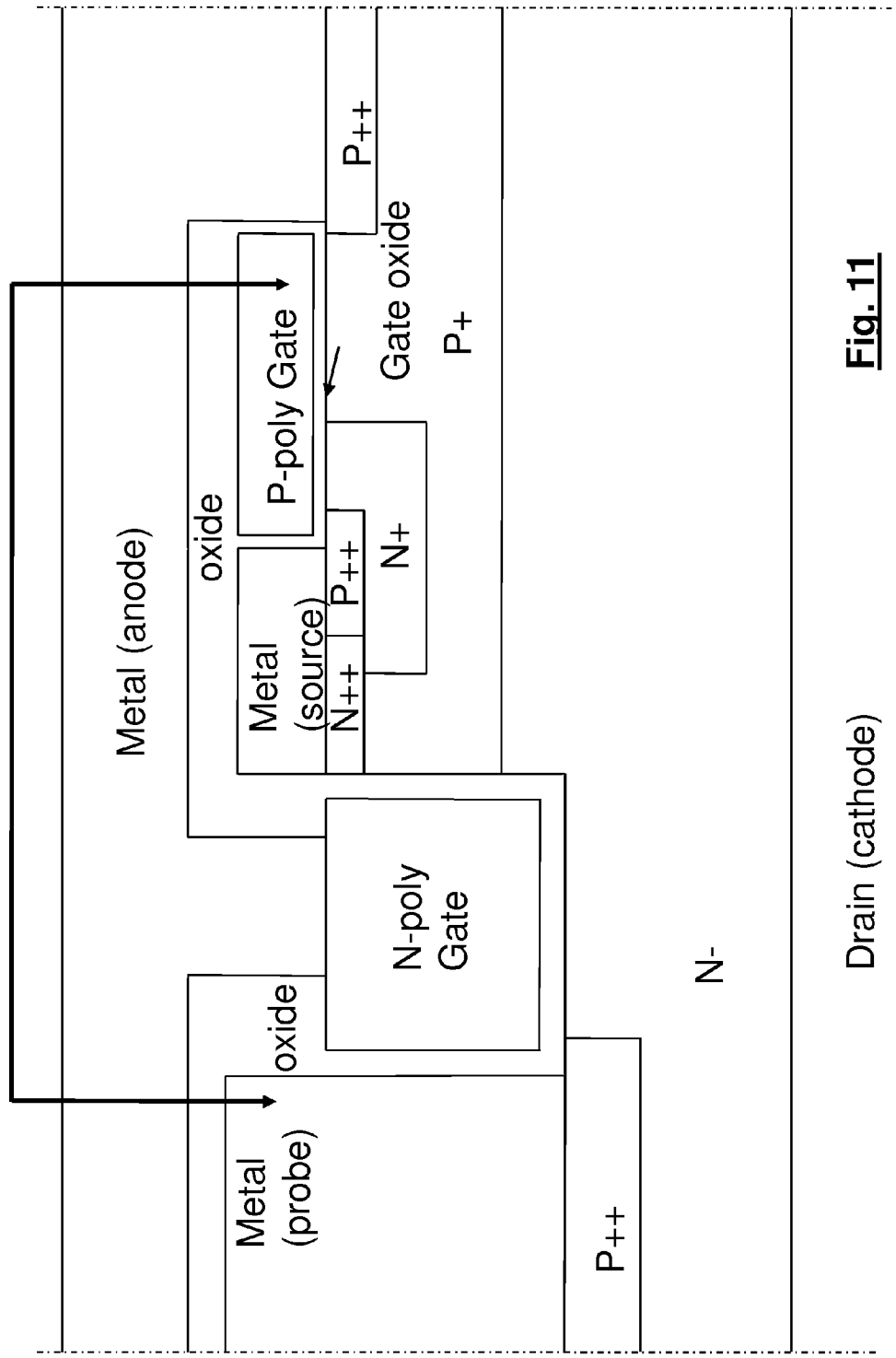
FIGS. 11 and 12 show two other sample embodiments, in which one or both sides of the rectifying diode are constructed using UMOS technology.
Figure 12:
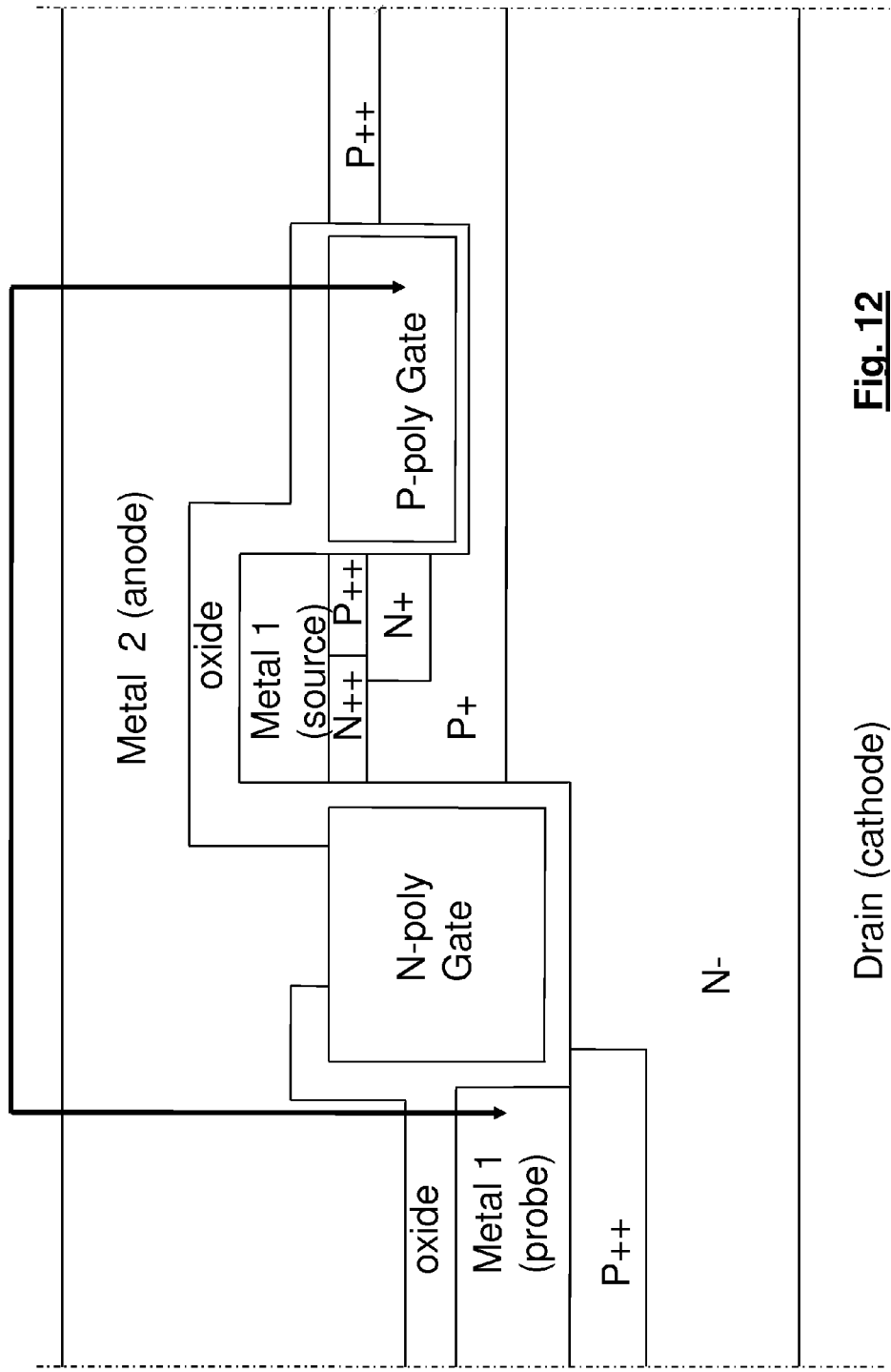

FIGS. 11 and 12 show, that the gates of regenerative field effect diode can be built also using UMOS technology. These modifications can provide higher Probe voltage and be used with thicker gate oxides, which may be preferable for some applications. Of course, many other implementations of vertical transistor structures are also possible.

Note that the operation of this device as a rectifying diode is quite different from normal MOSFET operation, where the polarity of the voltage between source and drain does not change. By contrast, with a rectifying diode the polarity will switch during operation, and sometimes the drain rather than the source will inject majority carriers.

Even more importantly, the cross-coupling between the N-channel and P-channel components of the diode changes the barrier heights advantageously. A normal field effect diode (like SBR) will have a constant potential barrier height between source and channel region, and therefore this method of rectification is very similar to Schottky barrier rectification. By contrast, using a regenerative (or bootstrap) diode as described above. the potential barrier height is modified by the applied gate voltage. Thus during forward bias (+ to anode and – to cathode) the potential barriers are slightly reduced. While in reverse bias the barrier height is automatically strongly increased by the gate voltage, leading to smaller leakage. Thus the main distinction of the new rectification method is the automatic barrier height adjustment during operation As discussed above, the use of RBB for one of the complementary devices provides the advantage of higher reverse breakdown voltage. On the other hand, the use of a simple MOSFET for one of the complementary devices aids integration, and also slightly reduces the forward voltage drop. Thus the combination of one RBB with one MOSFET is particularly advantageous. Even more specifically, the combination of an N-type RBB with a PMOS device, as shown for example in FIG. 9, appears to be a highly favored combination.

According to various disclosed embodiments, there is provided: A semiconductor diode comprising: first and second field-effect-gated current-conducting devices of opposite respective conductivity types, having respective sources thereof connected together, and each having a respective gate connected to the potential of a respective drift region of the other said MOS-gated device; said field-effect-gated current-conducting devices each having respective drain terminals, which are externally connected to provide anode and cathode connections respectively; wherein said devices have no other external electrical connection.

According to various disclosed embodiments, there is also provided: A semiconductor device comprising: a first semiconductor channel which electrically separates a first semiconductor source of a first conductivity type from a first drift region, and which is gated by a first gate electrode; a second semiconductor channel which electrically separates a second semiconductor source of a second conductivity type from a second drift region, and which is gated by a second gate electrode; said first and second sources being electrically connected together; a first external terminal, which is operatively connected to receive first-type majority carriers through said first drift region, and a second external terminal, which is operatively connected to receive second-type majority carriers through said second drift region; said first gate electrode being operatively connected to receive a potential which is dependent on the potential of said second drift region, and said second gate electrode being operatively connected to receive a potential which is dependent on the potential of said first drift region; whereby said first and second terminals provide rectification therebetween.

According to various disclosed embodiments, there is provided: A merged semiconductor device comprising: a first field-effect transistor structure, having a first semiconductor channel which electrically separates a first semiconductor source of a first conductivity type from a first drift region, and which is gated by a first gate electrode; said first drift region supplying first-type majority carriers both to a first drain structure, and also to a first probe node which is electrically separate from said first drain structure; a second field-effect transistor structure, having a second semiconductor channel which electrically separates a second semiconductor source of a second conductivity type from a second drift region, and which is gated by a second gate electrode; said second drift region supplying second-type majority carriers at least to a second drain structure; wherein said second gate electrode is connected to said first probe node, and said first gate electrode is connected to be driven by said second drift region; said first and second sources being electrically connected together; and said first and second drains being externally connected to provide rectification therebetween.

According to various disclosed embodiments, there is provided: A semiconductor device operable as a diode comprising Cathode contact made to a first drain region of the n-type conductivity, operatively coupled to a first source region, first gate region and first probe region; Anode contact made to a second drain region of the p-type conductivity, operatively coupled to a second source region, second gate region and second probe region; The first probe region being connected to the second gate region; the first gate region being connected to the second probe region; and the first source region being connected to the second source region.

According to various disclosed embodiments, there is also provided: A method for rectifying current from an anode terminal to a cathode terminal, comprising the actions of: a) when said cathode terminal is more negative than said anode terminal, then sinking current from said anode terminal through a first drift region and a first field-effect-gated channel to an n-type source, and also sourcing current to said cathode terminal from a p-type source through a second field-effect-gated channel and a second drift region; said n-type and p-type sources being electrically connected together; said second channel being gated by a second gate electrode which is coupled to said first drift region; and said first channel being gated by a first gate electrode which is coupled to said second drift region; to thereby reduce the potential barrier between said source and channel is reduced during forward bias conditions, and increase the potential barrier height during reverse bias conditions.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, as extensively discussed above, various combinations of MOS devices and RBB devices can be used to make up the complementary back-to-back pair.

For another example, the gate electrodes can be polysilicon (as in the embodiments described above), or can be silicided, or one or both can be metal (and possibly two different metals).

For another example, while the above examples are implemented in silicon, it is also possible to use SiGe, or many other semiconductors.

Note that both integrated and discrete embodiments have been described. Other modifications can be made for integration, such as use of a buried layer for the drain of the RBB, with electrical connection through a sinker diffusion.

While several described embodiments have the advantage of providing a two-terminal device, it is also possible to bring out external connections for one or both of the probe nodes and/or gate terminals.

It should also be noted that RBB devices do not strictly have to be vertical or quasi-vertical devices, as shown in the illustrated examples. Instead, a lateral RBB can be configured (alternatively and less preferably), by locating a probe node in proximity to the drift region of a large LDMOS.

Many other process modifications and device structures are also possible, as is well known to those skilled in the art of semiconductor devices.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor diode comprising:
   first and second field-effect-gated current-conducting devices of opposite respective conductivity types, the first and second devices each comprising gates, sources, and drains, the first and second devices having respective sources thereof connected together, the second field-effect-gated current-conducting device further comprising a drift region and a semiconductor region formed within the drift region, the gate of the first field-effect-gated current-conducting device being connected to the semiconductor region of the drift region of the second field-effect-gated current-conducting device;
   said first and second field-effect-gated current-conducting devices each having respective drain terminals, the drain terminal of the first field-effect-gated current-conducting device being connected to a first external terminal of the semiconductor diode and the drain terminal of the second field-effect-gated current-conducting device being connected to a second external terminal of the semiconductor diode, the first and second externally connected to provide anode and cathode connections of the semiconductor diode, respectively;
   wherein the semiconductor diode has no external electrical connection other than the anode and cathode connections,
   wherein said drift region of the first field-effect-gated current-conducting device is substantially lateral, and a drift region of the second field-effect-gated current-conducting device extends vertically downward to a backside drain connection structure of the first field-effect-gated current-conducting device.

2. A semiconductor device comprising:
   a first field-effect device of a first conductivity type, the first field-effect device comprising a first gate region, a first source region, a first drain region, a first drift region, a semiconductor region formed in the first drift region, a first conductive layer electrically connected to the first gate region, a second conductive layer electrically connected to the semiconductor region of the first drift region, and a third conductive layer electrically connected to the first source region, the first, second, and third conductive layers each being a different conductive layer; and
   a second field-effect device of a second conductivity type different from the first conductivity type, the second field-effect device comprising a second gate region, a second source region, and a second drain region, the second conductive layer being electrically connected to the second gate region and the third conductive layer being electrically connected to the second source region.

3. The semiconductor device of claim 2, wherein the semiconductor device is a two-terminal device having two external terminals, wherein a first external terminal is coupled to the first drain region and a second external terminal is coupled to the second drain region.

4. The semiconductor device of claim 3, wherein the semiconductor device is arranged as a diode, the first external terminal being an anode of the diode and the second external terminal being a cathode of the diode.

5. The semiconductor device of claim 2, wherein the first drift region in which the semiconductor region is formed is a drift region to carry current between the first source region and the first drain region when the first field-effect device is in a conductive state.

6. The semiconductor device of claim 2, wherein the first field-effect device further comprises a body region, where the first source region is formed in the body region and the first drift region is a portion of the body region.

7. The semiconductor device of claim 2, wherein the second conductive layer is not electrically connected to the first conductive layer.

8. The semiconductor device of claim 2, wherein the first source region is arranged to produce a depletion region in the first field-effect device when the first field-effect device is in a nonconductive state, and the semiconductor region is positioned in the first drift region such that the semiconductor region is within the depletion region when the first field-effect device is in the nonconductive state.

9. The semiconductor device of claim 2, wherein the first source region comprises a semiconductor region of the first conductivity type and the semiconductor region comprises a semiconductor material of the first conductivity type.

10. The semiconductor device of claim 9, wherein the semiconductor region is more heavily doped than the first source region.

11. The semiconductor device of claim 2, wherein each of the first, second, and third conductive layers is a metal layer.

* * * * *

UNITED STATES PATENT AND TRADEMARK OFFICE
CERTIFICATE OF CORRECTION

PATENT NO. : 8,633,521 B2
APPLICATION NO. : 12/683425
DATED : January 21, 2014
INVENTOR(S) : Alexei Ankoudinov et al.

It is certified that error appears in the above-identified patent and that said Letters Patent is hereby corrected as shown below:

TITLE PAGE

Under (73), entitled "Assignee:", the address should be updated from "Geneva (CH)" to read as follows:
--AMSTERDAM, Netherlands--.

Signed and Sealed this
Second Day of June, 2015

Michelle K. Lee
*Director of the United States Patent and Trademark Office*